United States Patent
Calvet et al.

(10) Patent No.: US 8,616,791 B2
(45) Date of Patent: Dec. 31, 2013

(54) ROTATIONALLY DEPLOYED ACTUATOR DEVICES

(75) Inventors: Robert J. Calvet, Pasadena, CA (US); Roman C. Gutierrez, Arcadia, CA (US)

(73) Assignee: DigitalOptics Corporation MEMS, Arcadia, CA (US)

( * ) Notice: Subject to any disclaimer, the term of this patent is extended or adjusted under 35 U.S.C. 154(b) by 176 days.

(21) Appl. No.: 13/247,869

(22) Filed: Sep. 28, 2011

(65) Prior Publication Data

US 2013/0077947 A1 Mar. 28, 2013

(51) Int. Cl.
*G03B 17/00* (2006.01)

(52) U.S. Cl.
USPC .................................................. 396/529

(58) Field of Classification Search
USPC .................................................. 396/529
See application file for complete search history.

(56) References Cited

U.S. PATENT DOCUMENTS

| | | |
|---|---|---|
| 2,774,001 A | 12/1956 | Riedel |
| 4,333,722 A | 6/1982 | Lee |
| 4,384,778 A | 5/1983 | Lee et al. |
| 4,408,857 A | 10/1983 | Frank |
| 4,496,217 A | 1/1985 | Aoyagi |
| 4,716,432 A | 12/1987 | Stephany |
| 4,860,040 A | 8/1989 | Tamamura et al. |
| 5,150,260 A | 9/1992 | Chigira |
| 5,386,294 A | 1/1995 | Ototake et al. |
| 5,699,621 A | 12/1997 | Trumper et al. |
| 5,825,560 A | 10/1998 | Ogura et al. |
| 5,867,302 A | 2/1999 | Fleming |
| 5,986,826 A | 11/1999 | Kosaka et al. |
| 5,995,688 A | 11/1999 | Aksyuk et al. |
| 6,033,131 A | 3/2000 | Ghosh |
| 6,068,801 A | 5/2000 | Bodo et al. |
| 6,205,267 B1 | 3/2001 | Aksyuk et al. |
| 6,239,473 B1 | 5/2001 | Adams |
| 6,262,827 B1 | 7/2001 | Ueda et al. |
| 6,291,875 B1 | 9/2001 | Clark |

(Continued)

FOREIGN PATENT DOCUMENTS

| | | |
|---|---|---|
| EP | 1855145 | 11/2007 |
| EP | 1959284 | 8/2008 |

(Continued)

OTHER PUBLICATIONS

Tsuboi, O, et al., "A Rotational Comb-Driven Micromirror with a Large Deflection Angle and Low Drive Voltage," Technical Digest. MEMS. IEEE International Conference on Microelectro Mechanical Systems, Jan. 20, 2002, pp. 532-535.

(Continued)

*Primary Examiner* — Rodney Fuller
(74) *Attorney, Agent, or Firm* — Haynes and Boone LLP (57) ABSTRACT

A method for making an actuator device includes forming a substantially planar structure, including an outer frame with a latch foot, a fixed frame coupled to the outer frame, a latch mass coupled to the fixed frame, a latch block coupled to the latch mass by a latch block flexure, a moveable frame coupled to the outer frame, and an actuator incorporating a plurality of interdigitated teeth alternately attached to the fixed and moving frames. For operation, the latch mass is rotated downward until an upper surface of the latch block is disposed below and held in latching contact with a lower surface of the latch foot by the latch block flexure.

23 Claims, 6 Drawing Sheets

(56) References Cited

U.S. PATENT DOCUMENTS

| | | |
|---|---|---|
| 6,392,703 B1 | 5/2002 | Uchino et al. |
| 6,426,777 B1 | 7/2002 | Sato |
| 6,497,141 B1 | 12/2002 | Turner et al. |
| 6,535,311 B1 | 3/2003 | Lindquist |
| 6,675,671 B1 | 1/2004 | Jokiel et al. |
| 6,679,055 B1 | 1/2004 | Ellis |
| 6,806,991 B1 | 10/2004 | Sarkar |
| 6,847,907 B1 | 1/2005 | Novotny |
| 6,850,675 B1 | 2/2005 | Calvet et al. |
| 6,914,635 B2 | 7/2005 | Ostergard |
| 6,950,570 B1 | 9/2005 | Novotny |
| 6,958,777 B1 | 10/2005 | Pine |
| 7,027,206 B2 | 4/2006 | Mochizuki |
| 7,038,150 B1 | 5/2006 | Polosky et al. |
| 7,113,688 B2 | 9/2006 | Calvet et al. |
| 7,148,603 B1 | 12/2006 | Garcia |
| 7,154,199 B2 | 12/2006 | Yasuda |
| 7,190,854 B1 | 3/2007 | Novotny |
| 7,266,272 B1 | 9/2007 | Calvet et al. |
| 7,285,879 B2 | 10/2007 | Osaka |
| 7,359,131 B1 | 4/2008 | Gutierrez et al. |
| 7,372,074 B2 | 5/2008 | Milne et al. |
| 7,436,207 B2 | 10/2008 | Rogers et al. |
| 7,477,842 B2 | 1/2009 | Gutierrez |
| 7,545,591 B1 | 6/2009 | Tong et al. |
| 7,555,210 B2 | 6/2009 | Calvet |
| 7,557,470 B2 | 7/2009 | Culpepper et al. |
| 7,579,848 B2 | 8/2009 | Bottoms et al. |
| 7,586,702 B1 | 9/2009 | Huang et al. |
| 7,645,627 B2 | 1/2010 | Christenson |
| 7,646,969 B2 | 1/2010 | Calvet et al. |
| 7,705,909 B2 | 4/2010 | Ishizawa et al. |
| 7,720,366 B2 | 5/2010 | Iwasaki et al. |
| 7,838,322 B1 | 11/2010 | Vargo |
| 7,855,489 B2 | 12/2010 | Hirano |
| 7,872,394 B1 | 1/2011 | Gritters et al. |
| 7,990,628 B1 | 8/2011 | Calvet et al. |
| 8,004,780 B2 | 8/2011 | Gutierrez et al. |
| 8,178,936 B2 | 5/2012 | Zhe et al. |
| 8,299,598 B2 | 10/2012 | Moden |
| 2001/0004420 A1 | 6/2001 | Kuwana et al. |
| 2002/0006687 A1 | 1/2002 | Lam |
| 2002/0070634 A1 | 6/2002 | Tai et al. |
| 2002/0105699 A1 | 8/2002 | Miracky et al. |
| 2002/0125789 A1 | 9/2002 | Brandt |
| 2002/0130586 A1 | 9/2002 | Mao |
| 2003/0026547 A1 | 2/2003 | Trzecieski |
| 2003/0048036 A1 | 3/2003 | Lemkin |
| 2003/0062422 A1 | 4/2003 | Fateley et al. |
| 2003/0063838 A1 | 4/2003 | Hagood |
| 2003/0076421 A1 | 4/2003 | Dutta |
| 2003/0086751 A1 | 5/2003 | Culpepper |
| 2003/0210116 A1 | 11/2003 | Lane et al. |
| 2004/0017360 A1 | 1/2004 | Kaneko et al. |
| 2004/0048410 A1 | 3/2004 | O'Brien et al. |
| 2004/0066494 A1 | 4/2004 | Lee et al. |
| 2004/0136680 A1 | 7/2004 | Medina |
| 2004/0183936 A1 | 9/2004 | Kim et al. |
| 2004/0184132 A1 | 9/2004 | Novotny |
| 2004/0189969 A1 | 9/2004 | Mizuno |
| 2004/0201773 A1 | 10/2004 | Ostergard |
| 2005/0000311 A1 | 1/2005 | Storm |
| 2005/0002008 A1 | 1/2005 | De Weerdt et al. |
| 2005/0002086 A1 | 1/2005 | Starkweather et al. |
| 2005/0007489 A1 | 1/2005 | Ahn et al. |
| 2005/0095813 A1 | 5/2005 | Zhu et al. |
| 2005/0139542 A1 | 6/2005 | Dickensheets et al. |
| 2005/0148433 A1 | 7/2005 | Wang et al. |
| 2005/0156481 A1 | 7/2005 | Zhou et al. |
| 2005/0219399 A1 | 10/2005 | Sato et al. |
| 2005/0249487 A1 | 11/2005 | Gutierrez |
| 2006/0028320 A1 | 2/2006 | Osaka |
| 2006/0033938 A1 | 2/2006 | Kopf et al. |
| 2006/0056084 A1 | 3/2006 | Araki |
| 2006/0092514 A1 | 5/2006 | Koo |
| 2006/0153556 A1 | 7/2006 | Lee et al. |
| 2006/0183332 A1 | 8/2006 | Kang |
| 2006/0192858 A1* | 8/2006 | Calvet .................. 348/208.7 |
| 2006/0193618 A1 | 8/2006 | Calvet |
| 2006/0204242 A1 | 9/2006 | Gutierrez et al. |
| 2006/0209012 A1 | 9/2006 | Hagood |
| 2006/0219006 A1 | 10/2006 | Nasiri et al. |
| 2006/0250325 A1 | 11/2006 | Hagood et al. |
| 2006/0252297 A1 | 11/2006 | Culpepper |
| 2006/0277997 A1 | 12/2006 | Foster |
| 2007/0024155 A1 | 2/2007 | Calvet |
| 2007/0133976 A1 | 6/2007 | Gutierrez |
| 2008/0020573 A1 | 1/2008 | Birkmeyer et al. |
| 2008/0044172 A1 | 2/2008 | Tang et al. |
| 2008/0054757 A1 | 3/2008 | Aksyuk |
| 2008/0198249 A1 | 8/2008 | Tanimura et al. |
| 2008/0240704 A1 | 10/2008 | Takahashi |
| 2008/0279498 A1 | 11/2008 | Sampsell et al. |
| 2008/0309191 A1 | 12/2008 | Chou |
| 2009/0031548 A1 | 2/2009 | Zaitsu |
| 2009/0185796 A1 | 7/2009 | Tsutsumi et al. |
| 2009/0213236 A1 | 8/2009 | Chiou et al. |
| 2009/0244302 A1 | 10/2009 | Tsai |
| 2009/0244668 A1 | 10/2009 | Fujino |
| 2009/0284816 A1 | 11/2009 | Davis |
| 2009/0310959 A1 | 12/2009 | Shih et al. |
| 2010/0050415 A1* | 3/2010 | Desai ........................ 29/428 |
| 2010/0232777 A1 | 9/2010 | Tseng et al. |
| 2010/0284081 A1 | 11/2010 | Gutierrez |
| 2011/0026148 A1 | 2/2011 | Tanimura et al. |
| 2012/0081598 A1* | 4/2012 | Calvet et al. ............ 348/357 |

FOREIGN PATENT DOCUMENTS

| | | |
|---|---|---|
| EP | 2264507 | 12/2010 |
| JP | 2006-297543 | 11/2006 |
| JP | 2008-010624 | 1/2008 |
| JP | 2010-145264 | 7/2010 |
| JP | 2010-167536 | 8/2010 |
| KR | 2008/0079115 | 8/2008 |
| WO | WO02/063371 | 8/2002 |
| WO | WO2008/061025 | 5/2008 |
| WO | WO2010/038229 | 4/2010 |

OTHER PUBLICATIONS

Yi, Chu, et al., "Design, Fabrication and Control of Components in MEMS-Based Optical Pickups," IEEE Transactions on Magnetics, IEEE Service Center, New York, US, vol. 17, No. 2, Feb. 1, 2007, pp. 780-784.

Minching, Wu, et al., "Development of Tracking and Focusing Micro Actuators for Dual-Stage Optical Pick-Up Head," Journal of Optics. A, Pure and Applied Optics, Institute of Physics Publishing, Bristol, GB, vol. 8, No. 7, Jul. 1, 2006, pp. S323-S329.

Seong-Hyok Kim, et al., Integrated Micro Optical Flying Head with Lens Positioning Actuator for Small Form Factor Data Storage, Transducers '03. 12th International Conference on Solid-State Sensors, Actuators and Microsystems. Digest of Technical Papers (Cat. No. 03TH8664), vol. 1, Jan. 1, 2003, pp. 607-610.

Sunghoon, Kwon, et al., "Large Displacement Vertical Microlens Scanner wit Low Driving Voltage," IEEE Photonics Technology Letters, IEEE Service Center, Piscataway, NJ, US, vol. 14, No. 11, Nov. 1, 2002.

Takahashi, K., et al.; "Switched-Layer Design for SOI Bulk Micromachined XYZ Stage Using Stiction Bar for Interlayer Electrical Connection," Journal of Microelectromechanical Systems, IEEE Service Center, US, vol. 18, No. 4, pp. 818-827, Aug. 1, 2009.

PCT/US 06/07024 Search Report of Nov. 28, 2007.

Akihiro Koga et al. "Electrostatic Linear Microactuator Mechanism for Focusing a CCD Camera"; Journal of Lightwave Technology, vol. 17, No. 1: p. 43-47; Jan. 1999.

* cited by examiner

ROTATIONALLY DEPLOYED ACTUATOR DEVICES

BACKGROUND

1. Technical Field

This disclosure generally relates to actuator devices, and more particularly, to MEMS actuator devices with motion control features and methods for making them that are suitable for use in miniature cameras and other optical devices.

2. Related Art

Actuators for use in miniature cameras and other devices are well known. Such actuators typically comprise voice coils or Lorentz actuators that are used to selectably move a lens for focusing, zooming, or optical image stabilization (OIS).

Miniature cameras are often incorporated into a variety of other types of electronic devices. For example, miniature cameras are commonly used in cellular telephones, personal digital assistants (PDAs), desk top and mobile computers, and surveillance systems. Miniature cameras can have many other applications as well, including medical applications, such as endoscopy and colonoscopy.

It is often desirable to reduce the size of miniature cameras. As the size of electronic devices continues to be reduced, the size of miniature cameras that are part of such electronic devices must typically be reduced as well.

Further, it is desirable to enhance the shock resistance of such miniature cameras. As the size of miniature cameras is reduced, smaller, more delicate components must often be utilized in their construction. Since such consumer products are typically subject to substantial abuse, such as rough handling and dropping, the components of miniature cameras must be protected from the shock that is associated with such abuse.

Accordingly, a need exists for reduced size actuator devices for use in miniature cameras and other devices that are capable of withstanding shock, along with reliable and cost effective methods for making them.

SUMMARY

In accordance with the present disclosure, actuator devices that are suitable for use in a variety of applications and methods for making and using them are provided.

In one embodiment, a method for making an actuator device comprises forming a substantially planar structure that includes an outer frame having a latch foot extending therefrom, a fixed frame coupled to the outer frame for rotational movement relative thereto, a latch mass coupled to the fixed frame for rotational movement relative thereto, the latch mass having a latch block coupled thereto by at least one latch block flexure, a moveable frame coupled to the outer frame for rotational movement relative thereto, and an actuator incorporating a plurality of interdigitated teeth, a fixed portion of which is attached to the fixed frame and a moving portion of which is attached to the moveable frame.

This actuator device can be deployed for operation by rotating the latch mass downward from a position coplanar with the outer frame, such that a side surface of the latch block makes contact with and slides down against an opposing side surface of the latch foot, and until an upper surface of the latch block is disposed below and held in latching contact with a lower surface of the latch foot by the at least one latch block flexure and the fixed portion of the actuator teeth is disposed at a selected angle relative to the moving portion of the actuator teeth.

In another embodiment, a method for making an actuator device comprises forming a substantially planar structure that includes an outer frame having a latch mass rotatably coupled thereto, the latch mass having a latch block coupled thereto by at least one latch block flexure, a fixed frame coupled to the outer frame, a moving frame rotatably coupled to the outer frame and the latch mass for rotational movement relative thereto, and an actuator incorporating a plurality of interdigitated teeth, a fixed portion of which is attached to the fixed frame and a moving portion of which is attached to the moveable frame.

This actuator device can be deployed for operation by rotating the latch mass upward from a position coplanar with the outer frame such that a side surface of the latch block makes contact with and slides up against an opposing side surface of the latch foot, and until an lower surface of the latch block is disposed above and held in contact with an upper surface of the latch foot by the at least one latch block flexure and the fixed portion of the actuator teeth is disposed at a selected angle relative to the moving portion of the actuator teeth.

A better understanding of the foregoing and many other features and advantages of the novel actuator devices of the present disclosure and the several methods of their manufacture, deployment and use can be obtained from a consideration of the detailed description of some example embodiments thereof below, particularly if such consideration is made in conjunction with the figures of the appended drawings, wherein like reference numerals are used to identify like elements illustrated in one or more of the figures.

DETAILED DESCRIPTION

Figure 1:
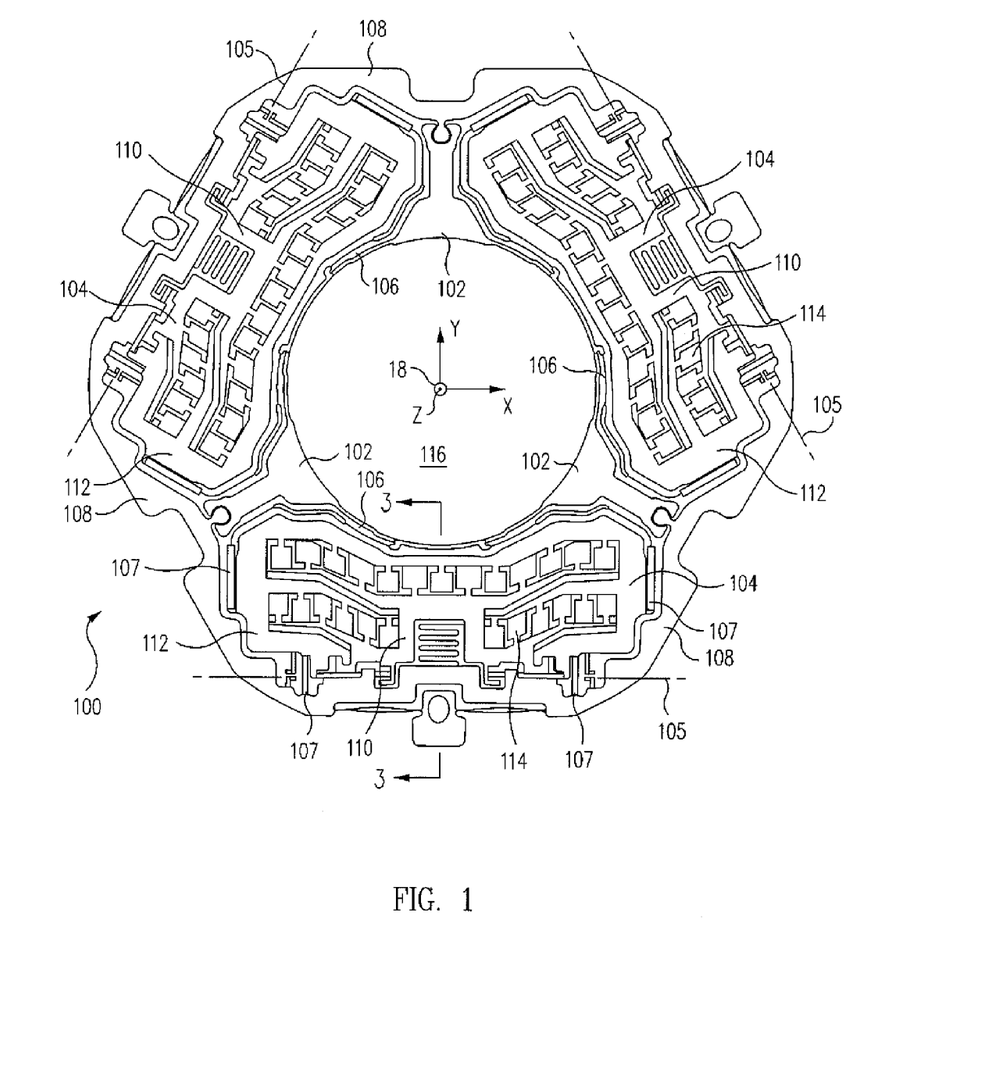
FIG. 1 is a front end plan view of an example embodiment of an actuator device in accordance with the present disclosure.
Figure 2:
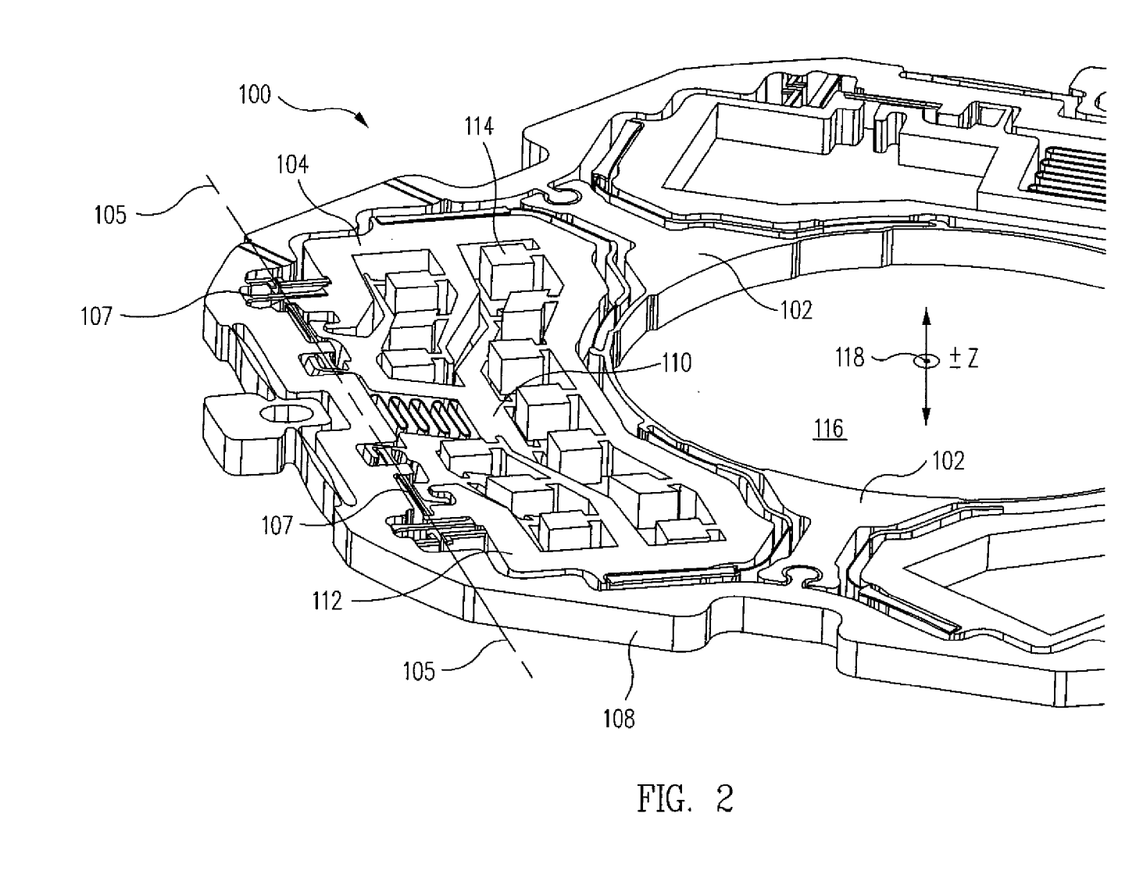
FIG. 2 is a partial perspective view of the example actuator device of FIG. 1.

In accordance with the present disclosure, linear actuators are provided that are suitable for use in a variety of applications, including optical applications. An example actuator device 100 useful for effecting, e.g., movement of a lens or lens group along an optical or Z axis of a camera or telephoto lens is illustrated in FIGS. 1 and 2 and described in detail in commonly owned U.S. patent application Ser. No. 12/946,515, filed Nov. 15, 2010, which is incorporated herein by reference. A miniature lens barrel for a camera incorporating such an actuator device 100 is described in detail in commonly owned U.S. patent application Ser. No. 12/946,680, also filed Nov. 15, 2010 and incorporated herein by reference.

As illustrated in FIGS. 1 and 2 and discussed in the foregoing disclosures, the generally planar actuator device 100 comprises a moveable stage 102 resiliently supported for movement in the ±Z direction, i.e., into and out of the plane of the device 100, two or more actuators 104, each coupled to an outer periphery of the stage 102 by one or more solid, resilient hinges, or "flexures" 106, and operable to apply a respective rotational force in the ±Z direction to the stage 102 when actuated, and an outer frame 108 surrounding and supporting the stage 102 and the actuators 104 during operation. In the particular actuator device 100 illustrated, three actuators 104 are provided, but in other possible embodiments, either a fewer or a greater number of actuators 104 can be employed.

As illustrated in the figures, in some embodiments, the actuator device 100 can comprise a microelectromechanical systems (MEMS) device 100 that can be fabricated as a single integral structure from a substrate of, for example, silicon, using well-known micromachining and/or photolithography techniques, and as illustrated in FIGS. 1 and 2, the actuators 104 can comprise, for example, electrostatic "comb drive" actuators, each comprising a fixed frame 110, a moving frame 112 resiliently supported for rotational movement relative to the fixed frame 110 and the outer frame 108, and a plurality of interdigitated teeth 114 alternately attached to the fixed and the moving frames 110 and 112.

Figure 3A:
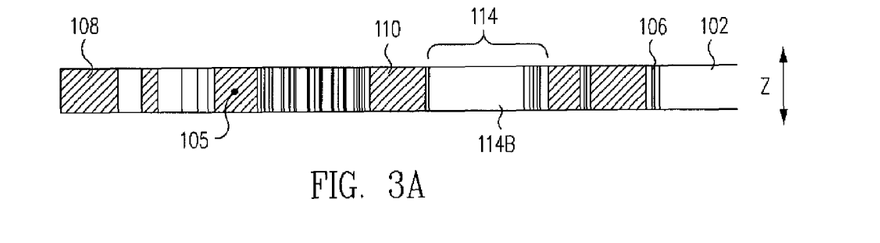
FIGS. 3A-3C are partial cross-sectional views of the actuator device of FIG. 1 as seen along the lines of the section 3-3 taken therein, respectively showing the device in an as-fabricated state, a deployed state, and a deployed and actuated state.
Figure 3B:
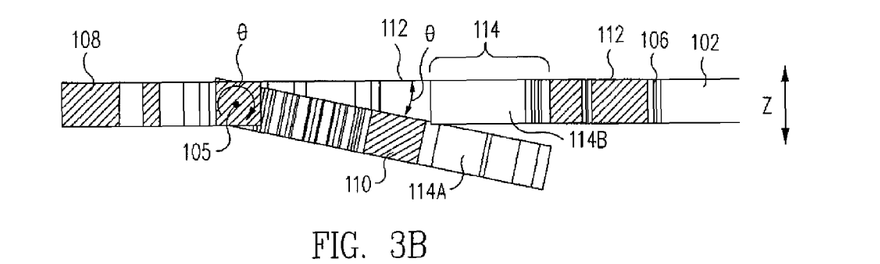
Figure 3C:
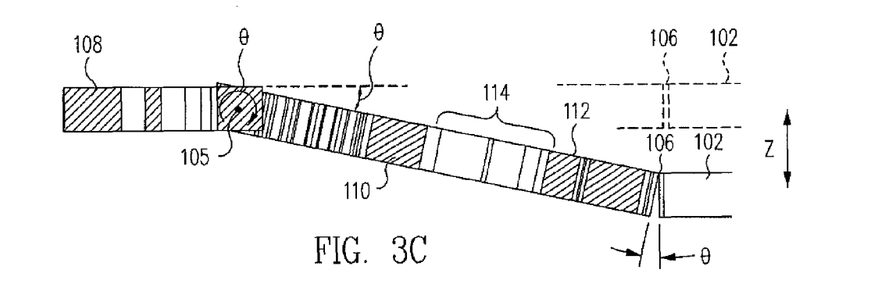

Additionally, as illustrated in FIGS. 1-3, in some embodiments, the stage 102 can incorporate a central opening 116 having a center or centroid 118, and within which, for example, a lens, a group of lenses (a lens group) or other types of optical elements can be concentrically mounted for conjoint movement with the stage 102 in the ±Z direction. Alternatively, the central opening 116 in the stage 102 can be omitted, such that the stage 102 defines a moveable platform upon which, for example, an integrated circuit (IC) comprising an imaging sensor of a known type can be mounted.

As discussed in more detail in the above commonly owned applications, in some electrostatically actuated embodiments, the actuator device 100 can be fabricated as a generally planar structure in which the interdigitated teeth 114 of the actuators 104 are disposed co-planar with each other, i.e., all lie in the plane of the device. As those of skill in the art will appreciate, in this orientation, the application of a voltage differential to the interdigitated teeth 114 of the comb drive actuators 104 cannot result in any desired out-of-plane movement of the stage 102 in the Z direction. Accordingly, as illustrated in FIGS. 3A-3C, prior to operation of such actuator devices 100, the fixed frame 110 of each actuator 104 is "deployed" to offset the adjacent pairs of teeth 114 respectively attached to the fixed and moving frames 110 and 112 at an angle θ with respect to one another. Such deployment results in a non-planar overall configuration of the actuator device 100. Methods and apparatus for rotationally deploying such an actuator device 100 for subsequent ±Z actuation and for fixing them in the deployed state are described in detail in commonly owned U.S. patent application Ser. No. 12/946,646, filed Nov. 15, 2010 and incorporated herein by reference.

As described therein, when thus deployed, each actuator 104 then includes a portion, viz., the fixed frame 110, that extends below the plane of the outer frame 108, as illustrated in FIGS. 2 and 3A-3C. Once deployed thus, the fixed frames 110 can then be respectively fixed or locked into position such that they do not move further with respect to the outer frame 108, and are angularly offset or "rotated" at an angle θ with respect to the associated moving frames 112. Actuation of the actuator 104, e.g., by application or removal of a voltage differential across the respective teeth 114 of the fixed and moving frames 110 and 112, will then cause the movable frames 112 to rotate down and toward or up and away from the deployed fixed frames 110 to effect a desired rectilinear movement of the stage 102, and hence, any optical element mounted thereon, in the ±Z direction.

Thus, as illustrated in FIGS. 1-3, in the particular example actuator device 100 illustrated, both the fixed and moving frames 110 and 112 are hinged by a plurality of flexures 107 to rotate downward about a common hinge line 105 relative to each other and the outer frame 108. Of course, as discussed in more detail below, other rotational hinging arrangements, not necessarily co-linear, are also possible. As illustrated in FIG. 3A, in the un-deployed state, the outer frame 108, the fixed and moving frames 110 and 112 (together with the interdigitated teeth 114A and 114B respectively affixed thereto), and the stage 102 hinged to the moving frame by the flexures 106, are all disposed coplanar with each other in the plane of the device 100.

As illustrated in FIG. 3B, when the actuator device 100 is deployed for operational use, the moving frame 110 of each actuator 104, together with its associated portion of comb drive teeth 114, is rotated downward about the hinge line 105 through the deployment angle θ and fixed at that position, leaving the fixed frame 112, associated teeth 114B and the stage 102 remaining disposed coplanar with the outer frame 108.

As illustrated in FIG. 3C, if different voltages are then respectively applied to the teeth 114A and 114B of the fixed and moving frames 110 and 112 of an actuator 104, the moving frame 112 will be attracted to and rotate downward toward the fixed frame 112, resulting in a corresponding downward rotational displacement of the stage 102. However, since the stage 102 is coupled to the moving frame 112 by flexures 106, and because the stage 102 is similarly coupled to one or more other actuators 104 disposed on the opposite side of the stage 102, the stage 102 will, rather than rotating, move with pure rectilinear movement in the −Z direction. Similarly, a removal of the voltage differential will result in a rectilinear movement of the stage 102 in the opposite, i.e., in the +Z direction, i.e., back toward its original position.

In the particular example embodiment illustrated in FIGS. 1-3, the fixed frame 110 and its associated teeth 114A are shown rotated downward relative to the moving frame 112 and its associated teeth 114B to effect deployment of the actuator device 100 for operation. However, as will be recognized by those of some skill in this art, a similar result can be obtained by rotating the moving frame 112, its associated teeth 114B, and the stage 102 upward relative to the fixed frame 110 and its associated teeth 114A, while leaving the latter features disposed generally coplanar with the outer frame 108. Such a deployment, as above, will likewise result in a non-planar overall configuration of the actuator device 100, except that it is the stage 102, moving frame 112 and associated fixed teeth 114B that are then displaced upwardly and out of the plane of the outer frame 108, moving frame 110 and associated moving teeth 114B.

In such an embodiment, if different voltages are then respectively applied to the teeth 114A and 114B of the fixed and moving frames 110 and 112 of an actuator 104, the moving frame 112 and its associated teeth 114B will, as before, be attracted to and rotate downward toward the fixed frame 110 and its associated teeth 114A, resulting in a corresponding downward rotational displacement of the stage 102. As above, since the stage 102 is coupled to the moving frame 112 by flexures 106, and because the stage 102 is similarly coupled to one or more actuators 104 disposed on the opposite side of the stage 102, the stage 102 will move, as above, with pure rectilinear movement in the −Z direction, and as above, a removal of the voltage will result in a rectilinear movement of the stage 102 in the opposite, i.e., in the +Z direction, back toward its original position.

Figure 4A:
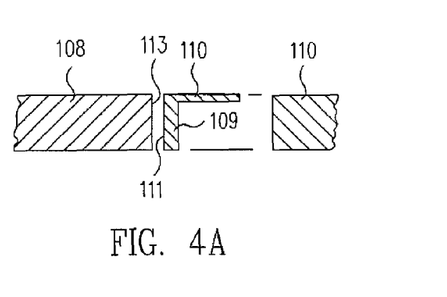
FIGS. 4A and 4B are partial cross-sectional views of a deployment foot of the example actuator device of FIG. 1, respectively showing the deployment foot before deployment of the device and adhesively fixed in place after deployment thereof.
Figure 4B:
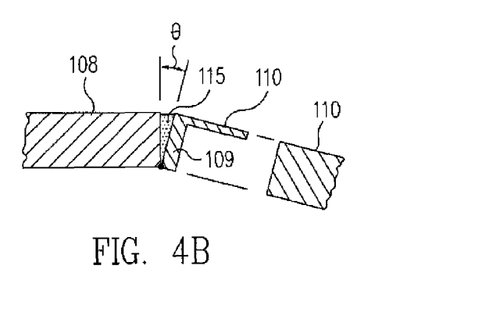

As those of some skill in this art will appreciate, in either case, when the fixed or moving frames 110 or 112 of the actuators 104 have been rotated to their respective deployed positions, it is desirable to fix them at that position relative to the outer frame 108. As discussed in commonly owned U.S. patent application Ser. No. 12/946,646 above, this fixing can be effected in a number of different ways. For example, as illustrated in FIG. 4A, the fixed frame 110, for example, can be provided with a deployment foot 109 having a side wall 111 disposed in spaced opposition to a side wall 113 of the outer frame 108. As illustrated in FIG. 4, after the fixed frame 110 has been rotated down through the deployment angle θ, a fillet 115 of, e.g., an adhesive, can be disposed in the angular space between the deployment foot 109 and the outer frame 108 to permanently fix the fixed frame 110 in the deployed position.

While the foregoing and other methods described in U.S. patent application Ser. No. 12/946,646 provide satisfactory measures for deploying and fixing the fixed or moving frames 110 or 112 of an actuator 104 in the deployed position, there may be cases in which it is desirable to deploy and fix the fixed or moving frames 110 by means of a more positive "latching" arrangement. In accordance with the present disclosure, apparatus and methods are provided for deploying and latching the fixed or moving frames 110 or 112 of the actuators 104 of an actuator device 100 in the deployed position using such latching mechanisms.

Figures 5A, 5B, 5C:
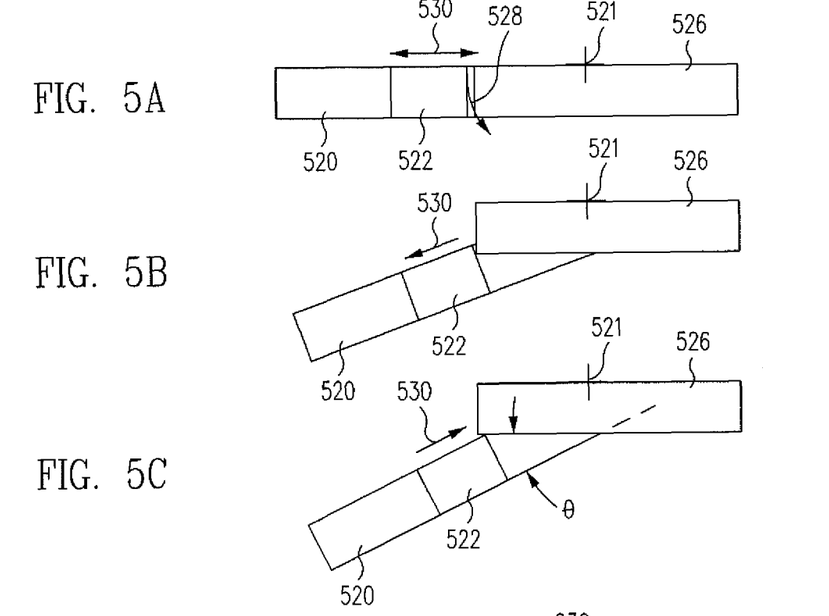
FIGS. 5A-5C are partial schematic side elevation views of an example rotational deployment latching mechanism for an actuator device in accordance with the present disclosure, respectively showing successive steps involved in the deployment and latching thereof.
Figure 7A:
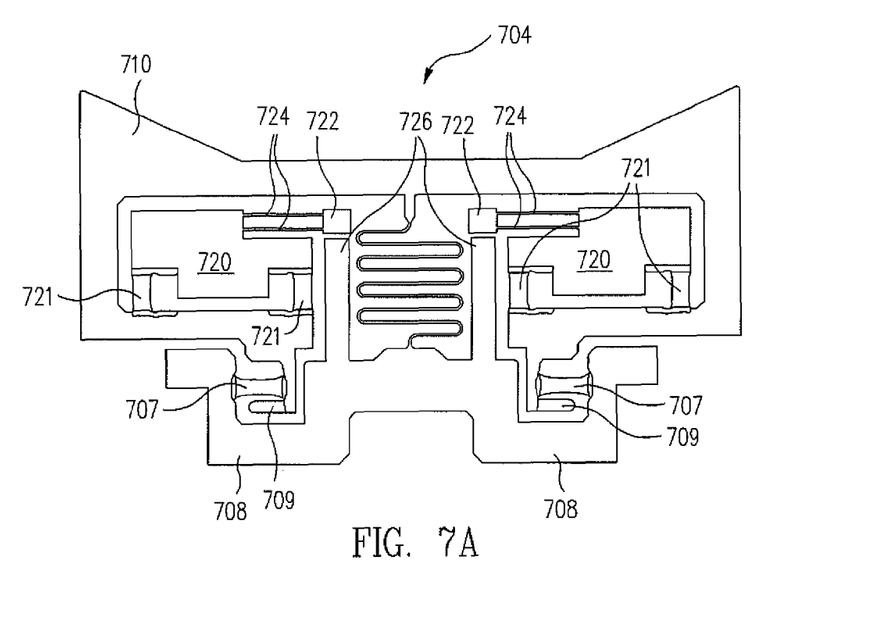
FIGS. 7A and 7B are, respectively, a partial top plan view of an actuator having an example rotational deployment latching mechanism in accordance with that of FIGS. 5A-5C, showing the actuator prior to deployment, and a partial upper left side perspective view of the actuator and latching mechanism of FIG. 7A, showing the actuator after deployment and latching.
Figure 7B:
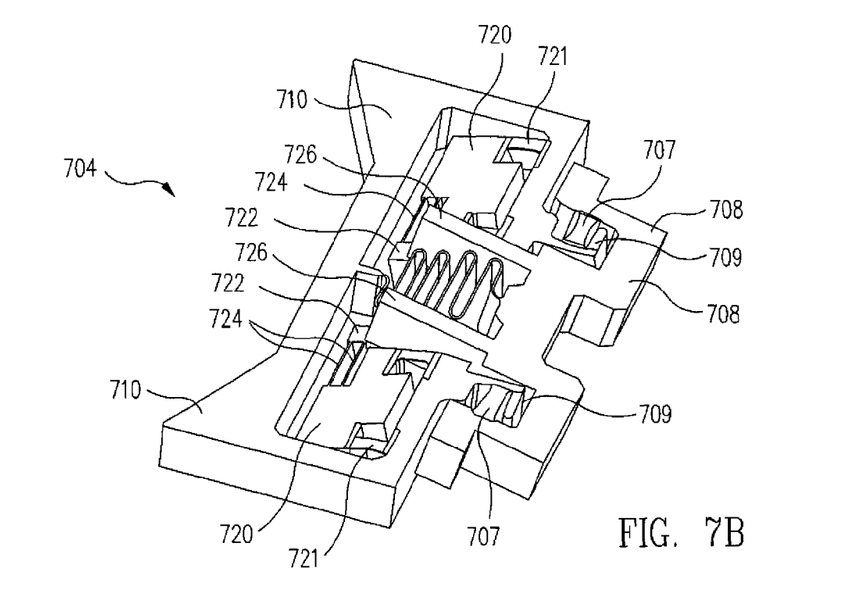

FIGS. 5A-5C are partial schematic side elevation views of an example rotational deployment latching mechanism for an actuator device 100 in accordance with the present disclosure, respectively showing successive steps involved in the deployment and latching thereof. FIGS. 7A and 7B are, respectively, a partial top plan view of an actuator incorporating the example rotational deployment latching mechanism of FIGS. 5A-5C, showing the actuator prior to deployment, and a partial upper left side perspective view of the actuator and latching mechanism of FIG. 7A, showing the actuator after the deployment and latching thereof.

Referring to FIGS. 7A and 7B, an example actuator 704 is illustrated in which a moving frame and its associated moving actuator teeth have been omitted for simplicity of illustration. As shown in FIG. 7A, the actuator 704 comprises an outer frame 708 and a fixed frame 710 coupled to the outer frame 708 by a plurality of outer hinging flexures 707, as in some of the embodiments described above. Additionally, a bilaterally symmetrical pair of latch masses 720 are each coupled to the fixed frame 710 by a plurality of deployment flexures 721. A bilaterally symmetrical pair of latch blocks 722 are each coupled to a corresponding one of the latch masses 720 by one or more latch block flexures 724. The latch block flexures 724 are configured to be relatively stiff in a direction normal to the plane of the actuator 704, but are relatively compliant in a direction parallel that plane. A bilaterally symmetrical pair of latch feet 726 project radially forward from the outer frame 708 such that respective ends of the latch feet 726 are spaced closely adjacent to corresponding ones of the latch blocks 722. In some embodiments, a plurality of deployment feet 709 of the type discussed above in connection with FIGS. 4A and 4B can be disposed on the fixed frame 710.

Referring now to FIGS. 5A-5C, wherein the foregoing latching features are referred to by like reference numbers, as illustrated schematically in FIG. 5A, as the latch masses 520 are depressed to rotate downwardly in the direction of the arrow 528 about a hinge 521 defined by the deployment flexures (not seen in FIGS. 5A-5C), each of the latch blocks 522 first makes contact with, then slides down against the opposing face of the corresponding latch foot 526, causing the latch block 522 and associated latch block flexures (not seen in FIGS. 5A-5C) to resiliently deflect laterally in the direction of the arrow 530, as illustrated in FIG. 5B. As illustrated in FIG. 5C, this downward rotation is continued until the upper surface of each latch block 522 is disposed below the lower surface of the corresponding latch foot 526, whereupon, the lateral tension built up in the latch block flexures causes the latch block 522 to spring back laterally in the direction of the arrow 530 to a position disposed below the lower surface of the corresponding latch foot 526, thereby latching the latch masses 520, and hence, the fixed frame (not seen in FIGS. 5A-5C) coupled thereto, at a downward angular position relative to the latch feet 526 and the fixed frame (not seen in FIGS. 5A-5C).

This "over-center" latching technique is illustrated in the perspective view of FIG. 7B, in which the latch masses 720 and associated latch blocks 722 are shown downwardly deployed, with the latch blocks 722 respectively tucked below the lower surface of corresponding ones of the latching feet 726 and held there resiliently by the latch block flexures 724, thereby preventing rotation of the latch blocks 722 back to their original in-plane positions. The rotated position of the latch masses 720 causes a corresponding torque to be applied to the fixed frame 710 by the deployment hinges 721, which in turn, causes the fixed frame 710 to rotate downward about the outer hinging flexures 707 until the deployment feet 709 contact the outer frame 708. This precisely sets the angular deployment position of the fixed frame 710 at −θ, at which point, the deployment feet 709 can be permanently bonded in place, as discussed above in connection with FIGS. 4A and 4B.

Figure 8:
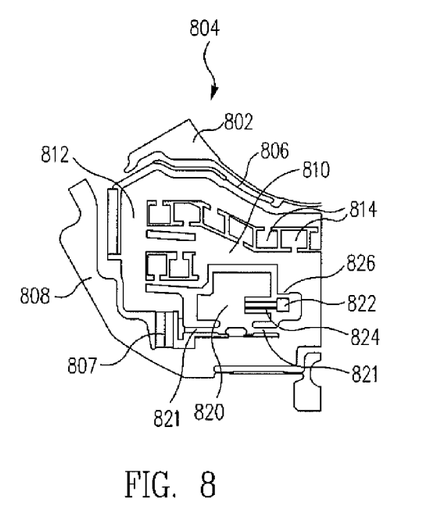
FIG. 8 is a partial top plan view of an individual actuator having a rotational deployment latching mechanism in accordance with that of FIGS. 6A-6C, showing the actuator before deployment.
Figure 8A:
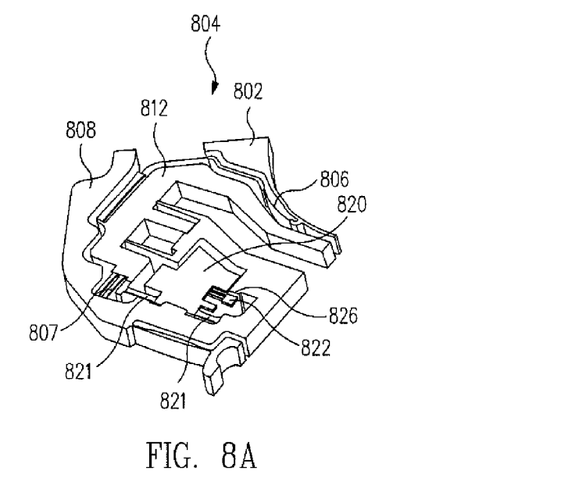
FIGS. 8A-8C are partial upper right side perspective views of the actuator and latching mechanism of FIG. 8, respectively showing successive steps involved in the deployment and latching thereof.
Figure 8B:
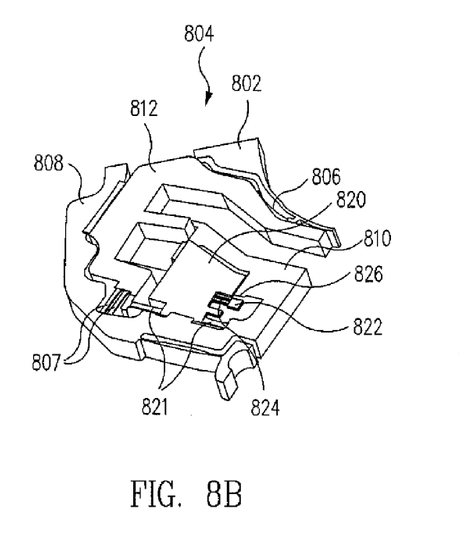
Figure 8C:
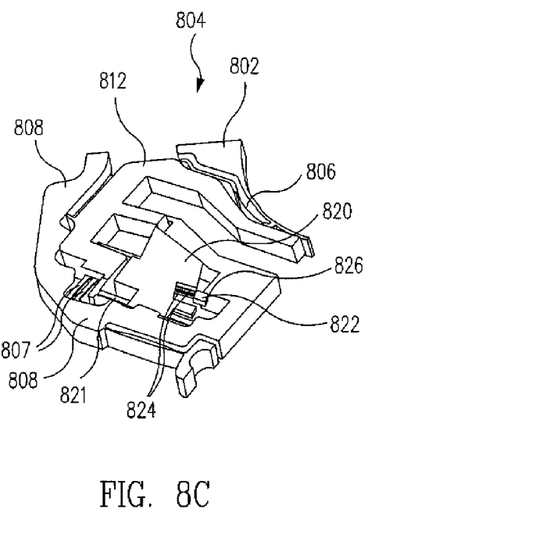

An alternative embodiment of the foregoing "over-center" latching technique is illustrated in FIGS. 8-8C and discussed below in connection with FIGS. 6A-6C. Referring initially to FIG. 8, a left-half portion of an actuator 804 is shown in plan view. The actuator 804 comprises an outer frame 808, a fixed frame 810 coupled to the outer frame 708, and a moving frame 812 coupled to the outer frame by a plurality of outer hinging flexures 807. Additionally, a latch mass 820 is coupled to the moving frame 812 by a plurality of deployment flexures 821. A latch block 822 is coupled to the latch mass 820 by one or more latch block flexures 824. As in the previous embodiment, the latch block flexures 824 are configured to be relatively stiff in a direction normal to the plane of the actuator 804, but are relatively compliant in a direction parallel that plane. A latch foot 826 projects rearwardly from the fixed frame 810 such that the outward end of the latch foot 826 is spaced closely adjacent to the latch block 822. It should be understood that the foregoing description applies to the left side of the actuator 804, and that a mirror image of the foregoing features are present on the right side thereof, such that the features are generally present in bilaterally symmetrical pairs.

Figure 6A:
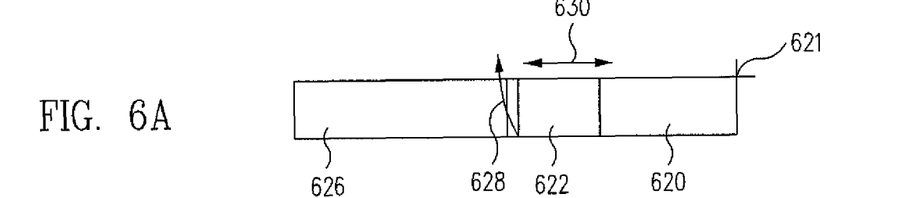
FIGS. 6A-6C are partial schematic side elevation views of another example rotational deployment latching mechanism of an actuator device in accordance with the present disclosure, respectively showing successive steps involved in the deployment thereof and latching thereof.
Figures 6B, 6C:
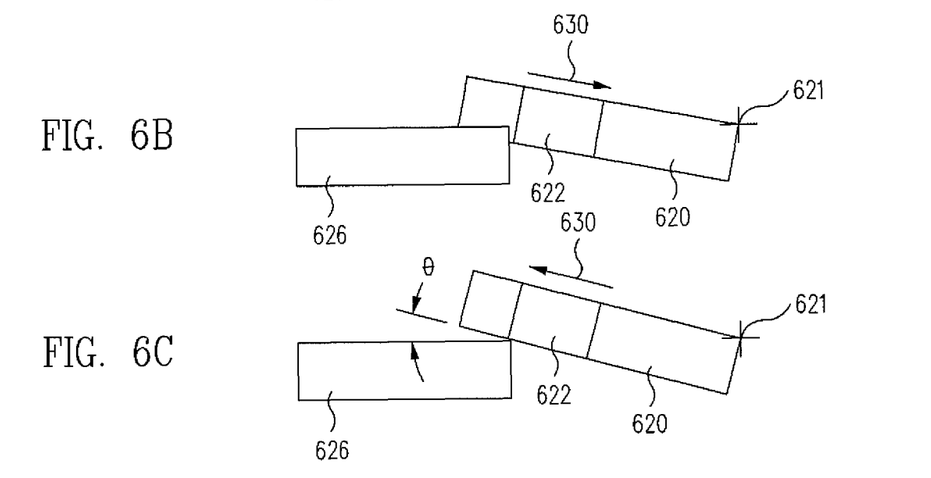

Referring now to FIGS. 6A-6C, wherein the foregoing latching features are referred to by like reference numbers, as illustrated schematically in FIG. 6A, as the latch mass 820 is raised so as to rotate upwardly in the direction of the arrow 628 about a hinge line 621 defined by the deployment flexures (not seen in FIGS. 6A-6C), the latch block 622 first makes contact with, then slides up against the opposing face of the adjacent latch foot 626, causing the latch block 622 and associated latch block flexures (not seen in FIGS. 6A-6C) to resiliently deflect laterally in the direction of the arrow 630, as illustrated in FIG. 6B. As illustrated in FIG. 6C, this upward rotation is continued until the upper surface of the latch block 622 is disposed above the upper surface of the latch foot 626, whereupon, the lateral tension built up in the latch block flexures causes the latch block 622 to spring back laterally in the direction of the arrow 630 to a position disposed above the upper surface of the latch foot 626, thereby latching the latch mass 620, and hence, the moving frame coupled thereto (not seen in FIGS. 6A-6C), at a upward angular position relative to the latch feet 626 and the fixed frame (not seen in FIGS. 6A-6C).

This alternative over-center latching technique is illustrated sequentially in the perspective views of FIG. 8A-8C. Thus, in FIGS. 8 and 8A, the actuator 804 is shown prior to deployment, with the latch block 822 and latch foot 826 disposed immediately adjacent to and spaced slightly apart from one another. In FIG. 8B, the latch mass 820 is shown rotated slightly upward about the deployment hinges 821, causing the latch block 822 to engage and slide upward against the opposing face of the latch foot 826 and, together with the latch flexures 824, to move laterally in the manner discussed above in connection with FIG. 6B. In FIG. 8C, the actuator 804 is shown fully deployed, with the latch block 822 disposed above the upper surface of the latch foot 826 and retained there by the latch block flexures 824, thereby preventing downward rotation of the latch block 822 back to its original in-plane positions. The rotated position of the latch mass 820 causes a corresponding torque to be applied to the moving frame 812 by the deployment hinges 821, which in turn, causes the moving frame 812 to rotate upward about the outer hinging flexures 807 until a torsional equilibrium is reached. This sets the nominal angle of the moving frame 812 at +θ, and thus, the +Z height of the stage 802 above the plane of the actuator device 800.

As those of some skill in this art will by now appreciate, and depending on the particular application at hand, many modifications, substitutions and variations can be made in and to the materials, apparatus, configurations and methods of deployment of the actuator devices of the present disclosure without departing from the spirit and scope thereof, and in light this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A method for making an actuator device, the method comprising:
    forming a substantially planar structure, comprising:
        an outer frame having a latch foot extending therefrom;
        a fixed frame coupled to the outer frame for rotational movement relative thereto;
        a latch mass coupled to the fixed frame for rotational movement relative thereto, the latch mass having a latch block coupled thereto by at least one latch block flexure;
        a moveable frame coupled to the outer frame for rotational movement relative thereto; and,
        an actuator incorporating a plurality of interdigitated teeth, a fixed portion of which is attached to the fixed frame and a moving portion of which is attached to the moveable frame; and,
    rotating the latch mass downward from a position coplanar with the outer frame such that a side surface of the latch block makes contact with and slides down against an opposing side surface of the latch foot and until an upper surface of the latch block is disposed below and held in latching contact with a lower surface of the latch foot by the at least one latch block flexure and the fixed portion of the actuator teeth is disposed at a selected angle relative to the moving portion of the actuator teeth.

2. The method of claim 1, wherein the forming comprises photolithography.

3. The method of claim 2 wherein the photolithography comprises one or more of etching and/or micromachining.

4. The method of claim 3, wherein the etching comprises deep reactive ion etching (DRIE).

5. The method of claim 3, wherein the micromachining comprises one or more of ion milling, laser ablation, chemical mechanical polishing (CMP), micro-electrical discharge forming and/or micro-forging.

6. The method of claim 1, wherein:
    the actuator device further comprises a deployment foot attached to the fixed frame and comprising a side wall disposed parallel to and in spaced opposition to a side wall of the outer frame;
    the rotating comprises rotating the fixed frame until a lower end of the opposing side wall of the deployment foot is disposed in abutment with the opposing side wall of the outer frame; and,
    the fixing comprises one or more of:
        bonding the lower end of the opposing side wall of the deployment foot to the opposing side wall of the outer frame with an adhesive;
        welding the lower end of the opposing side wall of the deployment foot to the opposing side wall of the outer frame with a weldment;
        bonding the opposing side wall of the deployment foot to the opposing side wall of the outer frame with a fillet of an adhesive; and/or,
        bonding a wedge between the opposing side wall of the deployment foot and the opposing side wall of the outer frame with an adhesive.

7. The method of claim 6, wherein the welding comprises one or more of laser welding and/or electron beam welding.

8. The method of claim 1, wherein the latch block is coupled to the latch mass by a pair of latch flexures, each having a stiffness in a direction perpendicular to a plane of the device greater than a stiffness in a plane parallel thereto.

9. An actuator device made in accordance with the method of claim 1.

10. An actuator device, comprising:
an outer frame having a latch foot extending therefrom;
a fixed frame coupled to the outer frame for rotational movement relative thereto;
a latch mass coupled to the fixed frame for rotational movement relative thereto, the latch mass having a latch block coupled thereto by at least one latch block flexure;
a moveable frame coupled to the outer frame for rotational movement relative thereto; and,
an actuator incorporating a plurality of interdigitated teeth, a fixed portion of which is attached to the fixed frame and a moving portion of which is attached to the moveable frame, wherein
the latch mass is rotated downward relative to the outer frame,
an upper surface of the latch block is disposed below and held in latching contact with a lower surface of the latch foot by the at least one latch block flexure, and
the fixed portion of the actuator teeth is disposed at a selected angle relative to the moving portion of the actuator teeth.

11. The actuator device of claim 10, further comprising a stage rotatably coupled to the moving frame by at least one flexure.

12. A camera incorporating the actuator of claim 10.

13. An electronic device incorporating the camera of claim 12.

14. The electronic device of claim 13, wherein the device comprises a cell phone, a smart phone, a personal digital assistant, a surveillance system or a computer.

15. A method for making an actuator device, the method comprising:
forming a substantially planar structure, comprising:
an outer frame having a latch mass rotatably coupled thereto, the latch mass having a latch block coupled thereto by at least one latch block flexure;
a fixed frame coupled to the outer frame;
a moving frame rotatably coupled to the outer frame and the latch mass for rotational movement relative thereto; and,
an actuator incorporating a plurality of interdigitated teeth, a fixed portion of which is attached to the fixed frame and a moving portion of which is attached to the moveable frame; and,
rotating the latch mass upward from a position coplanar with the outer frame such that a side surface of the latch block makes contact with and slides up against an opposing side surface of the latch foot and until an lower surface of the latch block is disposed above and held in contact with an upper surface of the latch foot by the at least one latch block flexure and the fixed portion of the actuator teeth is disposed at a selected angle relative to the moving portion of the actuator teeth.

16. The method of claim 15, wherein the forming comprises photolithography.

17. The method of claim 16 wherein the photolithography comprises one or more of etching and/or micromachining.

18. The method of claim 17, wherein the etching comprises deep reactive ion etching (DRIE).

19. The method of claim 17, wherein the micromachining comprises one or more of ion milling, laser ablation, chemical mechanical polishing (CMP), micro-electrical discharge forming and/or micro-forging.

20. An actuator device made in accordance with the method of claim 15.

21. The actuator device of claim 20, further comprising a stage rotatably coupled to the moving frame by at least one flexure.

22. An actuator device, comprising:
an outer frame having a latch mass rotatably coupled thereto, the latch mass having a latch block coupled thereto by at least one latch block flexure;
a fixed frame coupled to the outer frame;
a moving frame rotatably coupled to the outer frame and the latch mass for rotational movement relative thereto; and,
an actuator incorporating a plurality of interdigitated teeth, a fixed portion of which is attached to the fixed frame and a moving portion of which is attached to the moveable frame, wherein
the latch mass is rotated upward relative to the outer frame,
a lower surface of the latch block is disposed above and held in contact with an upper surface of the latch foot by the at least one latch block flexure, and
the fixed portion of the actuator teeth is disposed at a selected angle relative to the moving portion of the actuator teeth.

23. The actuator device of claim 22, further comprising a stage rotatably coupled to the moving frame by at least one flexure.

* * * * *